(12) United States Patent
Onoda et al.

(10) Patent No.: US 10,714,677 B2
(45) Date of Patent: Jul. 14, 2020

(54) GENERATION DEVICE AND DETECTION DEVICE OF MONOPOLE CURRENT, AND MEMORY ELEMENT USING A MONOPOLE CURRENT

(71) Applicant: RIKEN, Wako-shi, Saitama (JP)

(72) Inventors: Shigeki Onoda, Wako (JP); Sho Nakosai, Wako (JP)

(73) Assignee: RIKEN, Wako-Shi, Saitama (JP)

( * ) Notice: Subject to any disclaimer, the term of this patent is extended or adjusted under 35 U.S.C. 154(b) by 0 days.

(21) Appl. No.: 16/240,306

(22) Filed: Jan. 4, 2019

(65) Prior Publication Data
US 2019/0214547 A1  Jul. 11, 2019

(30) Foreign Application Priority Data
Jan. 5, 2018 (JP) .................... 2018-000344

(51) Int. Cl.
*H01L 43/02* (2006.01)
*G01R 19/00* (2006.01)
(Continued)

(52) U.S. Cl.
CPC ............. *H01L 43/02* (2013.01); *G01R 15/20* (2013.01); *G01R 19/0092* (2013.01); *H01L 39/025* (2013.01); *H01L 43/10* (2013.01)

(58) Field of Classification Search
CPC ............. H01L 21/02282; H01L 21/022; H01L 21/31691; H01L 28/75; H01L 28/55; H01L 28/56; H01L 39/025; H01L 43/02; H01L 43/10; H01L 43/00; G01R 19/0092; G01R 15/20
See application file for complete search history.

(56) References Cited

U.S. PATENT DOCUMENTS

2006/0234395 A1* 10/2006 Kijima ................ H01G 4/1245
438/3

OTHER PUBLICATIONS

Kimura et al. "Quantum fluctuations in spin-ice-like Pr2Xr2O7", Nature Commuications 4:1934, 2013. (Year: 2013).*
(Continued)

*Primary Examiner* — Caridad Everhart
(74) *Attorney, Agent, or Firm* — Seed IP Law Group LLP

(57) ABSTRACT

In order to provide a memory element configured to generate and detect monopole current, in an embodiment provided in the present disclosure is a monopole current generation detection device comprising a ferromagnetic quantum spin-ice layer, a buffer layer made of a material capable of exhibiting a quantum spin-liquid state, and a pair of electrodes disposed in contact with the buffer layer. In this device it is possible to apply a voltage between the pair of electrodes by providing a voltage application means. It is possible to generate a monopole current $J^m$ upon application of the voltage, where the monopole currents through the ferromagnetic quantum spin-ice layer and through another ferromagnetic quantum spin-ice layer that is in contact with the buffer layer on the other side of the ferromagnetic quantum spin-ice layer. Also, the monopole current can be electrically detected by providing a detection circuit to the device. In embodiments of the present disclosure, further provided is a memory element in which a buffer layer is sandwiched by two ferromagnetic quantum spin-ice layers.

10 Claims, 4 Drawing Sheets

(51) Int. Cl.
    *H01L 39/02*    (2006.01)
    *H01L 43/10*    (2006.01)
    *G01R 15/20*    (2006.01)

(56) References Cited

OTHER PUBLICATIONS

Björnsson, "Scanning superconducting quantum interference device microscope in a dilution refrigerator," Review of Scientific Instruments 72(11): 4153-4158, 2001. (6 pages).

Chang et al., "Higgs transition from a magnetic Coulomb liquid to a ferromagnet in $Yb_2Ti_2O_7$," *Nature Communications* 3:992, 2012. (7 pages).

Kato et al., "Numerical evidence of quantum melting of spin ice: quantum-to-classical crossover", *Physical Review Letters* 115(7):077202, 2015. (7 pages).

Kimura et al., "Quantum fluctuations in spin-ice-like $Pr_2Zr_2O_7$", *Nature Communications* 4:1934, 2013. (6 pages).

Onoda et al., "First-principles design of the spinel iridate $Ir_2O_4$ for high-temperature quantum spin ice," *Physical Review Letters* 122(6):067201, 2019. (5 pages).

\* cited by examiner

GENERATION DEVICE AND DETECTION DEVICE OF MONOPOLE CURRENT, AND MEMORY ELEMENT USING A MONOPOLE CURRENT

CROSS-REFERENCE TO RELATED APPLICATIONS

This application claims the priority of Japanese Patent Application No. 2018-000344 filed on Jan. 5, 2018, in the Japanese Intellectual Property Office, the disclosure of which is hereby incorporated by reference in its entirety.

BACKGROUND

Technical Field

The present disclosure relates to a generation device and a detection device of a monopole current, and a memory element using a monopole current.

Description of the Related Art

For integrated circuit applications, volatile memory devices including an SRAM (static random-access memory) and a DRAM (dynamic random-access memory) have been reduced into practice for decades. In addition to these volatile memory devices, which require continuous energy supply for retaining stored information, non-volatile memory devices such as a flash memory have attracted much attention in recent years. The flash memory is capable of high-speed operation, however it has a limited life of about several years at the maximum; there is a need for the development of a high performance non-volatile memory device that can operate on a permanent basis. Examples of solution to such needs include a FeRAM (ferroelectric memory, or ferroelectric random-access memory) that utilizes an orientation of remnant electric polarization in a ferroelectric material as its memorized state and an MRAM (magnetoresistive random-access memory) that utilizes an orientation of remnant magnetization of a ferromagnetic material as its memorized state. In particular, the research and development activity in the field of spintronics regarding the MRAM has been accelerated, as the MRAM is expected to have not only the non-volatility property, but a stable high-speed operation capability as well. Among several rewrite operation principles for the MRAM, what has been considered promising is devices that are operated based on a phenomenon called "spin-injection induced magnetization reversal," which utilizes a flow of spin-polarized and thus magnetized electrons in a magnetic material, or a "spin current." In such devices, there is no need for generating a strong magnetic field for rewrite operations, which enables low power consumption and high density integration.

In the meanwhile, it has been searched for a particle that carries "magnetic charge" or a divergence (source or sink) of the magnetic field, which may be considered a magnetic counterpart of an electrically charged particle carrying electric charge such as an electron. Although such a particle has not yet been discovered, it is possible for a field of magnetization at a position in a material to form one having a non-zero divergence value.

CITATION LIST

Non-Patent Literature

NPL1: Lieh-Jeng Chang, Shigeki Onoda, Yixi Su, Ying-Jer Kao, Ku-Ding Tsuei, Yukio Yasui, Kazuhisa Kakurai, and Martin Richard Lees, "Higgs transition from a magnetic Coulomb liquid to a ferromagnet in $Yb_2Ti_2O_7$", Nature Communications 3:992 (2012).

NPL2: K. Kimura, S. Nakatsuji, J-J. Wen, C. Broholm, M. B. Stone, E. Nishibori, and H. Sawa, "Quantum fluctuations in spin-ice-like $Pr_2Zr_2O_7$", Nature Communications 4:1934 (2013).

NPL3: Shigeki Onoda and Fumiyuki Ishii, "First-principles design of the spinel iridate $Ir_2O_4$ for high-temperature quantum spin ice", https://arxiv.org/abs/1612.00553v1 (submitted Dec. 2, 2016).

NPL4: Yasuyuki Kato and Shigeki Onoda, "Numerical evidence of quantum melting of spin ice: quantum-to-classical crossover", Physical Review Letters 115, 077202 (2015).

NPL5: P. G. Bjornsson, B. W. Gardner, J. R. Kirtley, and K. A. Moler, "Scanning superconducting quantum interference device microscope in a dilution refrigerator", Review of Scientific Instruments 72, 4153 (2001).

BRIEF SUMMARY

Technical Problem

Although the FeRAM is capable of performing a high-speed operation comparable to that of volatile memory devices, it still suffers from a problem of operation stability due to a leakage current. Also, the MRAM still needs threshold current reduction for the purpose of suppressing power consumption even the spin-injection induced magnetization reversal is adopted for it, as it is operated based on a principle that requires an electric current equal to or more than the threshold current be applied through a ferromagnetic metal when inverting the remnant magnetization therein. In addition, it is not always straightforward in MRAM to accurately understand the operation based on the concept of spin current, as the spin itself is not a conserved quantity.

The present disclosure addresses at least some of the problems mentioned above. The present disclosure provides a generation device and a detection device of monopole current; thereby it contributes to the development of any sort of equipment employing monopole current. In addition, the present disclosure provides a non-volatile memory element based on a novel operation principle; thereby it contributes to the sophistication of computer equipment that processes a huge amount of electronic information.

Solution to Problem

The inventors discovered a novel and operable principle in which magnetization at two interfaces of a ferromagnetic insulator quantum spin-ice layer can be inverted without neither applying an electric current to the magnetic material nor generating a strong magnetic field. Specifically, the ferromagnetic quantum spin-ice layer is arranged so as to be in contact with a buffer layer which is able to exhibit a quantum spin-liquid phase. By providing another ferromagnetic quantum spin-ice layer that is arranged so that it contacts with the buffer layer on the other side of the ferromagnetic quantum spin-ice layer and with a pair of electrodes attached to the buffer layer, it is possible to realize monopole current generation and monopole current detection in the other ferromagnetic quantum spin-ice layer.

Therefore, provided in one aspect of the present disclosure is a monopole current generation device, comprising: a ferromagnetic quantum spin-ice layer; a buffer layer that is in contact with the ferromagnetic quantum spin-ice layer and is made of a material capable of exhibiting a quantum spin-liquid state; and a pair of electrodes, each of which being separated from each other in one of in-plane orientations of the buffer layer and disposed in contact with the buffer layer; wherein the monopole current generation device is configured to generate a monopole current that has non-zero curl around the direction upon application of a voltage between the pair of electrodes, the monopole current flowing through the ferromagnetic quantum spin-ice layer and through another ferromagnetic quantum spin-ice layer that is in contact with the buffer layer on the other side of the ferromagnetic quantum spin-ice layer.

Furthermore, provided in another aspect of the present disclosure is a monopole current detection device, comprising: a ferromagnetic quantum spin-ice layer; a buffer layer that is in contact with the ferromagnetic quantum spin-ice layer and is made of a material capable of exhibiting a quantum spin-liquid state; and a pair of electrodes, each of which being separated from each other in one of in-plane orientations of the buffer layer and disposed in contact with the buffer layer; wherein the monopole current detection device detects a monopole current flowing through the ferromagnetic quantum spin-ice layer and through another ferromagnetic quantum spin-ice layer that is in contact with the buffer layer on the other side of the ferromagnetic quantum spin-ice layer while the monopole current has non-zero curl around the direction.

The inventors supposed further that if ferromagnetic magnetization at the interface between the ferromagnetic phase and the quantum spin-liquid phase can be reversed or its change can be detected, then the above problems found in the MRAM could be overcome. As a result, the inventors conceived of production of a novel memory element. Therefore, provided in one aspect of the present disclosure is a memory element, comprising, in the following order, a first ferromagnetic quantum spin-ice layer; a buffer layer made of a material capable of exhibiting a quantum spin-liquid state; and a second ferromagnetic quantum spin-ice layer, wherein the memory element further comprising a pair of electrodes disposed in contact with the buffer layer so as to generate electric polarization in the buffer layer having a component in one of in-plane orientations of the buffer layer.

It is possible to regard that there exists a magnetic monopole or a particle carrying a magnetic charge thereon (simply referred to as a monopole in this application) at a position where there is a non-zero divergence in a field of magnetization in a material. The spatial integration of the divergence in the field of magnetization M always vanishes trivially, and the monopole is therefore regarded as a conserved quantity. As a result, the monopole is substantialized as a particle having a polarity, i.e., an n-pole or s-pole, and a quantized magnetic charge for a magnetization. A material in which the monopole can be generated is a member of a material group where an appropriate spin-ice rule is effective and thus a quantum spin-ice system is formed therein, the group including, in particular, insulating pyrochlore oxides, which include magnetic rare earth ions (NPL1 and NPL2), an insulating spinel-type iridium oxide $Ir_2O_4$ (NPL3), and the like. Although it is difficult to create a monopole structure of magnetization locally in an ordinary magnetic media even when it is in an excited state, it becomes possible to do so in the quantum spin-ice-based material group.

The monopoles are governed by a virtual quantum electromagnetism and may be mobile. This makes it possible to create a monopole current, a flow carrying a magnetic charge while having properties as a particle. The origin of the field of magnetization in the material is attributed to the spins of electrons that are localized around atoms or atomic bonds in the material and bear local magnetization therein. Thus, once the magnetization of the electron spin is divided into a pair of monopoles having polarities of n-pole and s-pole, the monopoles can also propagate in the material according to interactions that exchanges adjacent spins. This current is regarded as a flow of a magnetic charge having a polarity of an n-pole or an s-pole with a certain amplitude, as an electric current is a flow of an electric charge. The inventors found a novel approach in which a monopole current can be driven and found that the monopole current may cause magnetization reversal in ferromagnetic media, thereby the inventors created the above-described aspects of the present disclosure. A material of a quantum spin-ice material is also reported where the monopole is described by a quantum mechanical wavefunction and may form a Bose-Einstein condensate to exhibit ferromagnetic properties (ferromagnetic quantum spin-ice material, NPL1). In the case of a quantum spin-ice material, it is theoretically predicted that some phenomena may take place, where the phenomena are monopole counterparts of a variety of phenomena for electric charges observed in superconductivity, which is also supported by the BCS theory that is explained as the Bose-Einstein condensation of Cooper pairs of electrons.

The quantum spin-liquid phase is a spin-liquid phase, in which spins and magnetization lose their order in the context of classical physics, but fully respect the quantum-mechanical properties. The quantum spin-liquid phase of this kind may be achieved after a material that may exhibit spin-ice state is cooled closely to the absolute zero of temperature and the spins are about to freeze, but rather the spins start to melt to exhibit a liquid state due to quantum-mechanical zero-point vibrations (NPL4). In such a quantum spin-liquid phase, a monopole can be generated as a particle with an explicit energy gap at a low temperature near the absolute zero. The monopole current is generated not deep in the buffer layer that exhibits a quantum spin-liquid phase, but only at its interfaces with the ferromagnetic quantum spin-ice layers.

In the aspect in which the memory element is implemented, in the case when medium where the monopole is generated is a ferromagnetic material, that is, in the case the monopole current is found to be in the thin ferromagnetic quantum spin-ice material, the monopole current exerts increase/decrease action or inverting action to the magnetization in the ferromagnetic phase. Memorized information in the memory elements is stored and held in the state of magnetization (e.g., orientation) in the ferromagnetic quantum spin-ice state. The state of the magnetization can be read out, for instance, by a magneto-optical Kerr effect; as a result, a read out function for the magneto-optical memory element can be implemented. Also, it is possible to measure actually transferred amount of magnetic charge or the number of monopoles if a conventional magnetic head or a scanning superconducting quantum interference device (scanning SQUID, NPL5) is disposed oppositely to the surface of an end, which enables manufacturing of highly integrated magnetic memory elements.

In the aspects of the present disclosure, a ferromagnetic quantum spin-ice layer may include a thin film that has a material subject to a spin-ice rule and exhibiting ferromagnetism. In the following description, "quantum" may be indicated explicitly when referring to terms such as a ferromagnetic quantum spin-ice layer. This reflects the fact that the monopole current behaves, among others, in the low-temperature quantum mechanical regime. In the present application the terminology according to the art of the technical field of present disclosure, such as those mentioned above, may be adopted as long as it does not make the description unclear.

Advantageous Effects of Disclosure

In an aspect of the present disclosure, provided is a monopole current generation device and a monopole current detection device that are operated with a novel principle. In another aspect of the present disclosure, provided is a magnetic memory element that comprises a monopole current generation device for controlling the magnetization therein.

BRIEF DESCRIPTION OF THE SEVERAL VIEWS OF THE DRAWINGS

FIG. 2A is one to be arranged with lamination on one surface of a substrate; and FIG. 2B is one to be arranged in a tiling manner on one surface of a substrate.

FIG. 4A illustrates a crystal structure of a layer under test; FIG. 4B is a calculated result of the fraction and the phase of the Bose condensate of monopole at each position of FIG. 4A; and FIG. 4C is density of a monopole supercurrent with respect to a phase mismatch.

DETAILED DESCRIPTION

Figure 1:
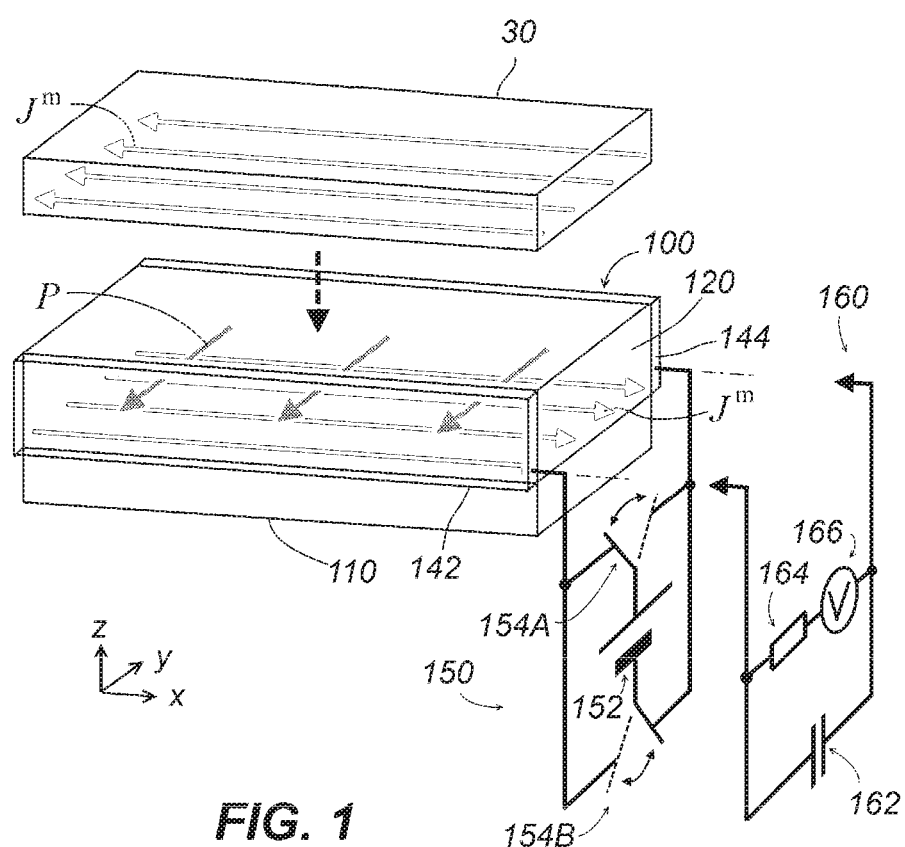
FIG. 1 is a perspective view illustrating a fundamental structure of a generation device and a detection device of a monopole current in an embodiment of the present disclosure.

Hereinafter, embodiments related to a generation device and a detection device of a monopole current device and a memory element according to the present disclosure will be described with reference to the drawings. In the description, common parts or elements throughout the drawings are denoted by the same reference numerals, unless otherwise noted. In addition, each element in the drawings should be understood as not being drawn to scale.

1. Generation Device and Detection Device of a Monopole Current

FIG. 1 is a perspective view illustrating a fundamental structure of a generation device and a detection device of a monopole current. A generation and detection device of a monopole current 100 (hereinafter referred to as "monopole current generation detection device 100") of the present embodiment includes a ferromagnetic quantum spin-ice layer (FM layer) 110 and a buffer layer 120. The buffer layer 120 is made of a material that can exhibit a quantum spin-liquid phase, on which a pair of electrodes 142 and 144 is disposed. As in a typical arrangement shown in FIG. 1 the FM layer 110 and the buffer layer 120 are laminated on their thickness direction (the z direction); and the pair of electrodes 142 and 144 is formed on the buffer layer 120 so that the electrodes are separated along the y direction.

In the case the monopole current generation detection device 100 is operated as a monopole current detection device, the detection circuit 160 is electrically connected to the pair of electrodes 142 and 144. The detection circuit 160 includes a capacitor 162 having an extremely large capacitance, a resistor 164, and a voltmeter 166. The amount of transferred electric charges is obtained as the amount of electric charges accumulated in the capacitor 162, or from the product of the voltage difference and the electrostatic capacity.

In the case the monopole current generation detection device 100 is operated for a monopole generation device, a voltage application means 150 serving as a drive circuit is connected to the pair of electrodes 142 and 144. The voltage application means 150 acts as a driving circuitry for producing a potential difference to the buffer layer 120.

The monopole current generation detection device 100 does not include a layer corresponding to a second FM layer 230 in memory elements 200A and 200B, which will be described later with reference to FIGS. 2A and 2B. In place of such a layer disposed is a layer under test 30 that is a target material in which a monopole current is generated or measured for the monopole current generation detection device 100. To clarify this point in FIG. 1, the position where the layer under test 30 is attached to the monopole current generation detection device 100 is indicated by a chain line arrow. The layer under test 30 is another ferromagnetic quantum spin-ice layer different from the FM layer 110. As shown in FIG. 1, the layer under test 30 and the FM layer 110 are configured to sandwich the buffer layer 120 while being in contact with the buffer layer 120.

The generation principle of monopole current using the monopole current generation detection device 100 is as follows. An electric polarization P having a component in one of in-plane orientations (the y direction in the figure) is generated inside the buffer layer 120 upon voltage application by the voltage application means 150. The voltage application means 150 is generally configured to adjust the voltage and its polarity; it is equipped with, for example, a variable voltage source 152 and switches 154A and 154B for inverting the voltage output from it. The magnitude and polarity of the electric polarization P to be generated inside the buffer layer 120 is adjustable. In response to the electric polarization P generated in the buffer layer 120 via the pair of electrodes 142 and 144, monopole currents are generated in the interior of the FM layer 110 and the layer under test 30, the monopole currents being antiparallel to each other having a curl component along the electric polarization P in accordance with the virtual quantum electromagnetism. That is, when the electric polarization P is generated in the buffer layer 120, the typical monopole current $J^m$ is generated as shown in FIG. 1. The monopole currents $J^m$ have their position in the vicinity of the interface of the buffer layer 120 side in the FM layer 110 and the layer under test 30 and their directions, which is antiparallel to each other, along perpendicular orientation to the internal electric field (the y direction) in the buffer layer 120 in the x direction, that is, toward the x direction and the minus x direction. Although the layer under test 30 is in contact with the buffer layer 120, the FM layer 110 and the layer under test 30 are separated from each other along the z direction by a thickness of the buffer layer 120. Therefore, the curl of the monopole currents $J^m$ are directed along the y direction in the buffer layer 120. Thus, it is possible to generate monopole currents in the layer under test 30.

On the other hand, the detection principle using the monopole current generation detection device 100 is as follows. In the buffer layer 120, an electric polarization P is induced in response to monopole currents generated inside of the FM layer 110 and the layer under test 30 and flowing in antiparallel to each other. The electric current generated by the induced electric polarization is accumulated in the capacitor 162. By measuring the voltage difference across the capacitor 162 by the voltmeter 166, the electric polarization generated in the buffer layer 120 is determined from the electrostatic capacity and variation of the voltage difference. If the relationship between the measured value of the electric polarization and the measured value of the monopole current, described later in connection with the leakage magnetic field measurement, is prepared specifically for the monopole current generation detection device 100 in advance, it is possible to determine direction and intensity of the monopole currents generated in the layer under test 30 from the measured value of the electric polarization.

Materials of layers of the monopole current generation detection device 100 include, typically, a crystal of $Yb_2Ti_2O_7$ for the FM layer 110 with the thickness in the z direction is about 1 nm, which is formed to have the thickness of about or above 1 nm typically, or around its unit cell size. The buffer layer 120 is typically $Pr_2M_2O_7$, where M denotes Zn, Sn, Hf, etc. Other materials for the memory elements 200A and 200B, described later, can also be adopted for the corresponding layers of the monopole current generation detection device 100.

2. Memory Element

Figure 2A:
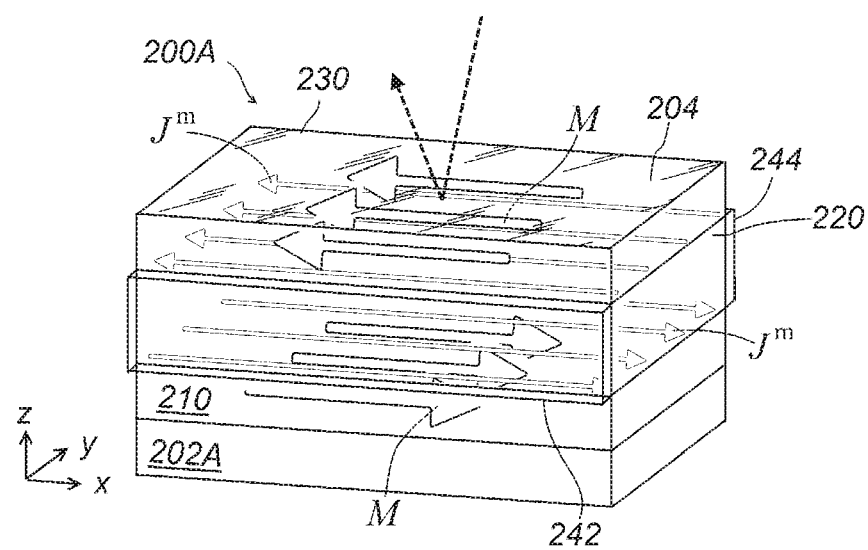
FIGS. 2A and 2B are perspective views illustrating a fundamental structure that may be operated as a magnetic memory element with a monopole current generation device in an embodiment of the present disclosure.
Figure 2B:
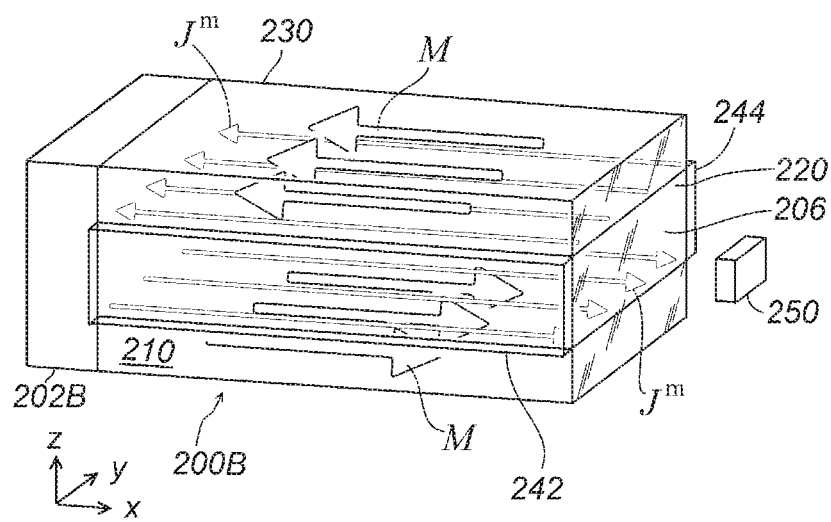

FIGS. 2A and 2B are perspective views illustrating a fundamental structure that may be operated for a memory element with an electrical generation device of a monopole current in the present embodiment; FIG. 2A is one to be arranged with lamination on one surface of a substrate; and FIG. 2B is one to be formed in a tiling arrangement on one surface of a substrate. Electric polarizations are omitted in these drawings.

2-1. Structure

The memory elements 200A and 200B have a first ferromagnetic quantum spin-ice layer (first FM layer) 210, a buffer layer 220 of a material which can exhibit a quantum spin-liquid phase, and a second ferromagnetic quantum spin-ice layer (second FM layer) 230 in the structure. In the case of the memory element 200A shown in FIG. 2A, a laminated structure on one surface of a substrate 202A is formed by a successive growth, on the first FM layer 210, of the buffer layer 220 and the second FM layer 230. In contrast, in the case of the memory element 200B shown in FIG. 2B, the first FM layer 210, the buffer layer 220, and the second FM layer 230 are grown to be in a tiling arrangement in a plane parallel to the y-z plane on a substrate 202B, thereby of the first FM layer 210, the buffer layer 220, and the second FM layer 230 are made to have a layered structure. The buffer layer 220 is a layer of a quantum spin-ice material that can exhibit quantum spin-liquid phase. The first and second FM layers 210 and 230 are thin films of ferromagnetic quantum spin-ice materials. That is, in either of the memory elements 200A and 200B, the first and second FM layers 210 and 230 made of ferromagnetic quantum spin-ice materials sandwich the buffer layer 220 made of a quantum spin-ice material. A pair of electrodes 242 and 244 is attached to the buffer layer 220. Arrangements of them are the same as one of the pair of electrodes 142 and 144 of the monopole current generation detection device 100 (FIG. 1). The pair of electrodes 242 and 244 is connected with the voltage application means 150, shown in FIG. 1, through appropriate wiring. As is evident from the comparison with the monopole current generation detection device 100 in FIG. 1, the memory elements 200A and 200B have the second FM layer 230 instead of the layer under test 30.

2-2. Principles of Rewrite and Store Operations

When a monopole current is adopted, the distributions of monopole magnetic charges in the first and second FM layers 210 and 230, i.e., the magnetizations M in these layers, can be reversed (flipped) while their relative relationships are kept unchanged, or while maintaining their antiparallel configuration between the first and second FM layers 210 and 230. Here, the orientation (polarity) of the monopole current $J^m$ in the first and second FM layers 210 and 230 and resulting direction (polarity) of the ferromagnetic magnetization M are determined by a direction (polarity) of the applied electric polarization. The polarity of the voltage required for inverting the magnetization is determined in accordance with the direction of the magnetization. The time integration value of the monopole current is directly reflected in the modulation of magnetization accompanying the reversal operation. Thus, the magnetization flip operation for the first and second FM layers 210 and 230 corresponds to a bit inversion operation of memory contents, or rewrite operation, for the memory element 200A and 200B.

The magnetization M in the first and second FM layers 210 and 230 after the modulation by the monopole current $J^m$ is maintained according to their ferromagnetic property. The magnetization M will be maintained so long as any specific rewrite operation is not performed; thus the magnetizations in the first and second FM layers 210 and 230 serve as a storage mechanism of the memory elements 200A and 200B.

2-3. Performances of Rewrite and Store Operations

The flip operation by way of the monopole current described above can be operated at high speed. Based on theoretical predictions, the time scale for this magnetization flip is determined by the interaction constant of the quantum spin-ice material. To be more specific in terms of a frequency, for a typical existing material that would serve as a candidate for the first and second FM layers 210 and 230 such as $Yb_2Ti_2O_7$, it is possible to operate at a high speed of about 10 GHz. Therefore, the restriction that may be attributed to its principle will not raise a problem in respect of the speed of the rewrite operation.

Also, the power consumption required for flipping magnetization is extremely small. The amount of power consumption is such that electric polarization can be produced in the buffer layer 220 serving as a quantum spin-liquid. Since the buffer layer 220 is a dielectric substance having a high insulation property, the flipping causes a charging of the capacitor formed by the pair of electrodes 242 and 244, which requires power consumption corresponding to electric power due to the transient current.

2-4. Read Operation of Memory States

The memory states of the memory elements 200A and 200B can be read by any technique that can read, for example, a direction of magnetization in the second FM layer 230 or the direction of the leakage magnetic field formed by the first and second FM layers 210 and 230.

One preferable example of such operations in the memory element 200A is to utilize a magneto-optical Kerr effect, which is a conventional magneto-optical effect. In the magneto-optical Kerr effect, a surface 204, which is an end of the second FM layer 230, is irradiated with polarized light to detect polarity of polarization rotation in the reflected light. A beam arrangement for reading is shown by a dashed line in FIG. 2A. When the magneto-optical effect is adopted, the size of the ferromagnetic thin film is preferably larger than a certain lower limit. In the case of the memory element 200A in FIG. 2A, it is necessary for the length within the x-y plane of the second FM layer 230 to be longer than a wavelength of laser light for reading (e.g., 250 nm), as the direction and magnitude of the magnetization in the second FM layer 230, for example, are read from the upper surface by way of the magneto-optical Kerr effect.

One preferable example of the read operations of memory states in the memory element 200B, in addition to the magneto-optical Kerr effect, is one that measures a leakage magnetic field in the vicinity of a surface 206. Based on polarity and magnitude detected by a magnetic detector element 250, such as a magnetic head and a scanning SQUID element that are mechanically scanned as necessary (see NPL5) or the like, it is possible to read the direction and the intensity of magnetization in the second FM layer 230. As described herein, any technique may be employed for reading operation, or bit reading, of memory content.

2-5. Example Materials and Structures

The substrates 202A and 202B are typically a crystal of $Yb_2Ti_2O_7$ or $Eu_2Ti_2O_7$ having a pyrochlore structure. The first and second FM layers 210 and 230 are a crystal of $Yb_2Ti_2O_7$ having a pyrochlore structure, typically. The thickness of the first and second FM layers 210 and 230 in the z direction in the drawings is typically about 1 nm, and about 1 nm or more of the thickness of the unit cell, typically. The buffer layer 220 is a crystal of $Pr_2Zr_2O_7$, $Pr_2Sn_2O_7$, or $Pr_2Hf_2O_7$ having a pyrochlore structure, typically. In addition, $Tb_2Ti_2O_7$ may also be used for the buffer layer 220 with fine adjustment of its composition. The thickness in the z direction of the buffer layer 220 is suitably selected from a range of several nm or more, typically. As will be apparent to those skilled in the art, these thin films can be formed by an arbitrary method of forming a crystalline thin film. For example, a PLD (pulsed laser deposition) method is one of promising techniques.

When reading the magnetization in the second FM layer 230 by the magneto-optical Kerr effect, the reading wavelength is selected in accordance with the purpose. In the case the memory element 200A is arranged in an array and integrated, the lower limit of its size may depend on the reading wavelength. Typically, if an Al(In, Ga)N solid ultraviolet laser (wavelength: 250 nm) is assumed for one of realistic examples, it would be possible to design the area of the memory element 200A to 0.06 $\mu m^2$ or so.

On the other hand, when reading a change in the magnetic field generated around there by a conventional magnetic head, it is effective to bring the magnetic head closer to the surface 206 on the side of the memory element. In that case, since the lower limit required for detection for a scale of length regarding the surface 206 is 10-20 nm or so, it is possible for the memory element 200B to adapt itself to a large scale integration by arranging ones on, for example, y-z plane in FIGS. 2A and 2B, along which direction the substrate 202B extends.

At the time of the present application, in order to realize a quantum spin-liquid state reliably for the buffer layer 220, it is necessary to cool the pyrochlore substance down to 0.2 K or less, typically. However, it is promising to employ a thin film substance $Ir_2O_4$, as another candidate material, where Li is de-intercalated from the iridium spinel Li $Ir_2O_4$. This is because the temperature scale can be increased up to room temperature for the thin film material $Ir_2O_4$ (NPL3). Therefore, the operation in the present embodiment can be expected to be applied at a higher temperature. By substituting Ir with another element (for example, Rh) for adjusting the lattice constant, $Ir_2O_4$ can be adopted not only for the ferromagnetic quantum spin-ice layer, but for the buffer layer, as it can be a quantum spin-liquid.

3. Confirmation of Operational Principle

Next, in order to check the above-described principle the inventors confirmed as to how the monopole current is generated based on the theoretical calculation. The generation of the monopole current is shown through numerical simulations that are supported by theory. In the first place of the procedure, a Hamiltonian is formulated in which pseudo spins, each having a spin quantum number of ½, exert ferromagnetic interaction in a crystal lattice of a pyrochlore structure for the quantum spin-ice material. Next, an emergent U(1) gauge field generated therein is analyzed based on the mean field theory. The monopole wavefunction is determined by a self-consistent method under appropriate boundary conditions.

Figure 3:
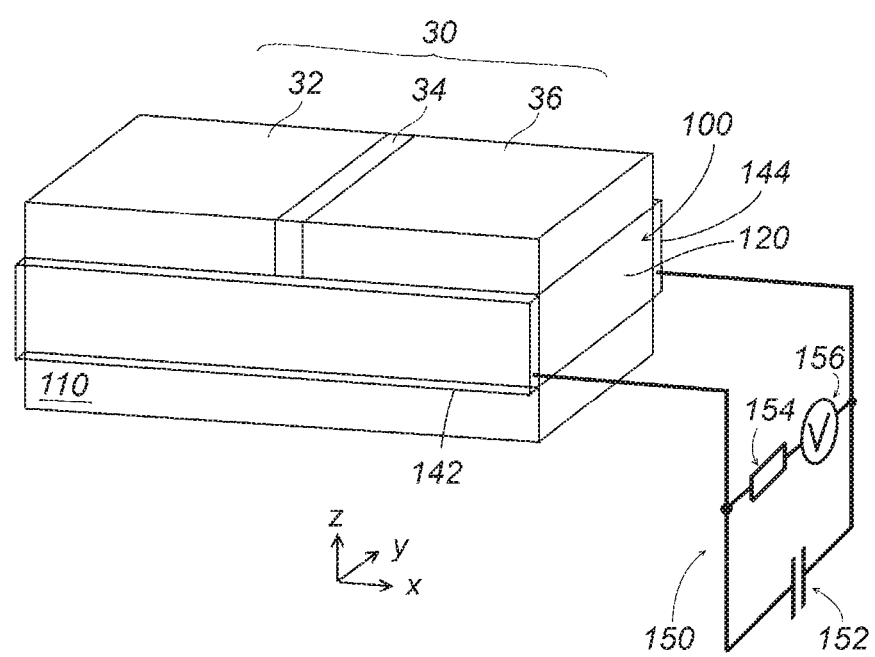
FIG. 3 is an explanatory diagram depicting an arrangement adopted for theoretical calculation in an embodiment of the present disclosure, a generation detection device of monopole current where a junction is provided for a layer under test.

FIG. 3 indicates the structure of the test layer 30 having a junction formed by a left (L) ferromagnetic quantum spin-ice section 32, a gap section 34, and a right (R) ferromagnetic quantum spin-ice section 36, adopted for the theoretical calculation, where the monopole current, magnetization, and electric polarization are omitted in the depiction. This junction is analogous to a Josephson junction in superconductivity. A monopole supercurrent through the junction is generated in such a manner that its intensity reflects a mismatch in the phase of the monopole wavefunction across the junction, namely, between the L and R ferromagnetic quantum spin-ice sections 32 and 36. The monopole supercurrent is a monopole current exhibiting superfluidity produced by Bose-Einstein condensation of the monopole. The monopole current generation detection device 100 of the present embodiment can detect the monopole supercurrent by means of electrical methods. It is to be noted that the monopole supercurrent in the theoretical calculation described herein is only for the purpose of presenting a different example from the electric polarization P (FIG. 1) that is configured to generate a monopole current $J^m$, in which example a monopole current with a similar property can be generated. It should also be noted that the layer under test 30 with the junction shown in FIG. 3 is set forth merely as an example of techniques for generating a monopole current, and that types for a layer under test 30 where a monopole current can be detected by the monopole current generation detection device 100 in FIG. 1 is not limited to those illustrated herein. The monopole current generation detection device 100 can also detect a monopole current that does not exhibit superfluidity and can detect a monopole current in the test layer 30 without junction.

A material of the L and R ferromagnetic quantum spin-ice sections 32 and 36 is any material capable of generating a monopole current, or a crystal of $Yb_2Ti_2O_7$, typically. As for the size and material of the gap section 34, the gap is made to separate the L and R ferromagnetic quantum spin-ice sections 32 and 36 from each other by a distance that allows the monopole current to tunnel for conduction therethrough and a material serving as a quantum spin-liquid is disposed in the gap section 34 for completing the junction. Also, the operation of the present embodiment can be verified when the gap section 34 is made to be a simple gap.

Figure 4A:
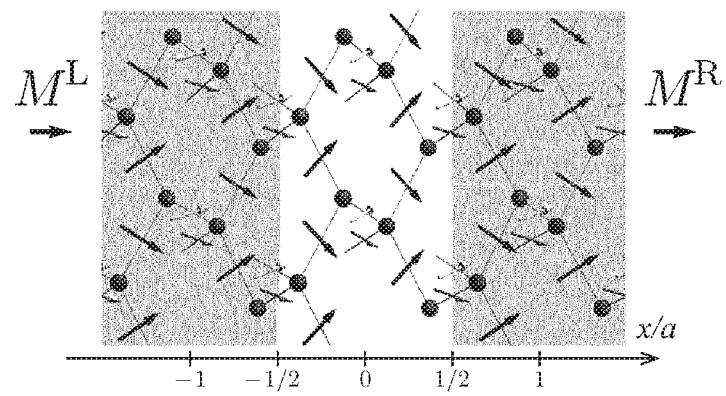
FIGS. 4A, 4B and 4C are explanatory diagrams depicting exemplary calculation results of density of a monopole supercurrent in an embodiment of the present disclosure.
Figure 4B:
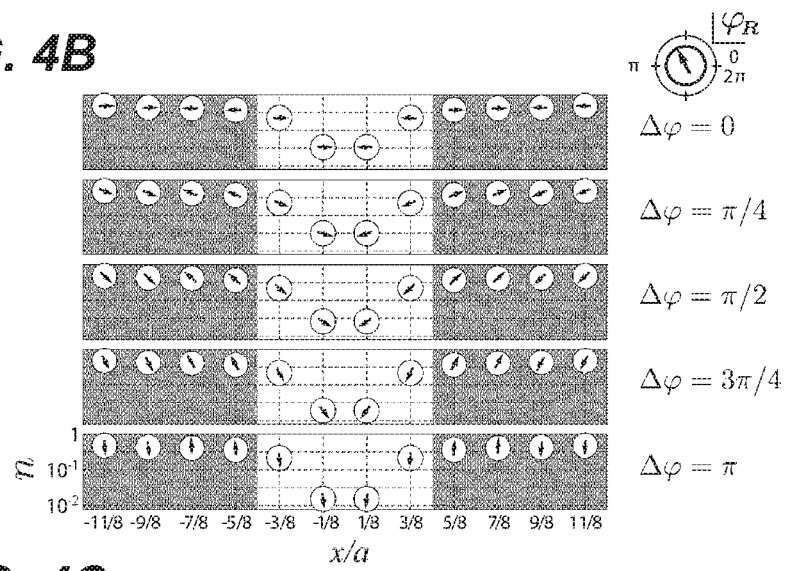
Figure 4C:
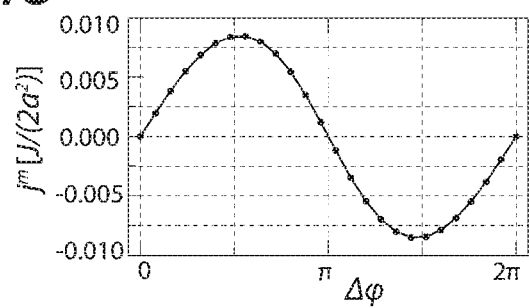

FIGS. 4A, 4B and 4C are explanatory diagrams depicting exemplary calculation results of the monopole density $J^m$ of the monopole supercurrent carried out by the inventors. FIG. 4A illustrates a crystal structure of the layer under test 30 near the gap section 34 along the x direction, which is depicted in a horizontal direction on the paper surface of FIGS. 2A and 2B. Also spins of some electrons are indicated in the drawing. In this exemplary calculation, the gap section 34 is set to have a width of one unit cell in the x direction so that it is made almost the same as a coherence length of the monopole supercurrent, while its actual size is determined according to the crystal lattice constant. The width is about 1 nm in the case of the pyrochlore substances mentioned above. Regions of the ferromagnetic quantum spin-ice sections 32 and 36 are shown by shadows on both sides of the gap section 34. The x direction of the graph is scaled by the unit cell a. FIG. 4B is a calculated result of fraction n of the superfluid density of monopoles at corresponding positions in FIG. 4A in the case when the macroscopic magnetization of the L- and R-ferromagnetic quantum spin-ice sections 32 and 36, denoted by $M^L$ and $M^R$ respectively, are parallel with each other along the x direction. The calculation is performed for five values of the phase mismatch (right end) in wave functions of the monopole current between the ferromagnetic quantum spin-ice sections 32 and 36. Circles mimicking timepiece dials indicate calculated values of the fractions n in log plot by their vertical positions on the paper surface and the phase values of the monopole by their arrows in the circles. Furthermore, FIG. 4C indicates the density $j^m$ of the monopole supercurrent with respect to a phase mismatch, shown at the right end of FIG. 4B, between the L- and R-ferromagnetic quantum spin-ice sections 32 and 36. That the monopole supercurrent flow takes a non-zero value means that there should be found a monopole supercurrent due to phase mismatch between the L- and R-ferromagnetic quantum spin-ice sections 32 and 36. In addition, values corresponding to the vertical axis of FIG. 4C should be detected as electric potential differences observed at the pair of electrodes 242 and 244 due to an electric polarization P induced in the buffer layer 220 when the monopole current generation detection device 100 is adopted. Alternatively, they can also be detected by a magnetic head or a scanning SQUID as described above. Thus, the monopole supercurrent caused by the phase mismatch can be detected by adopting the monopole current generation detection device 100 in FIG. 1.

4. Variation Examples

The monopole current generation detection device 100 and the memory elements 200A and 200B may be reduced into practice with various modifications. For instance, as described in connection with memory elements 200A and 200B, the arrangement of the substrates is freely selected in the monopole current generation detection device 100. In addition, both the voltage application means 150 and the detection circuit 160 are connected with the pair of electrodes 142 and 144 at the same time for the monopole current generation detection device 100 after necessary modifications in the field of circuit technology are made. It is also possible to arrange the memory elements 200A and 200B differently from those that are depicted in the drawings, for example, the arrangement of the pair of electrodes 242 and 244 connected with the buffer layer 220, according to the implementation necessity, such as facilitating integration.

The embodiments of the present disclosure have been concretely described above. Each of the above-described embodiments, variations and specific examples has been described for the purpose of explaining the disclosure; therefore, the scope of the disclosure of the present application should be determined based on the claims. Also, modifications within the scope of the present disclosure including other combinations of the respective embodiments are also included in the scope of the claims.

INDUSTRIAL APPLICABILITY

The present disclosure utilizes a monopole current of the present disclosure and can be used for any device that utilizes a device or a storage device.

REFERENCE SIGNS LIST 100 monopole current generation device and detection device (monopole current generation detection device)
110 ferromagnetic quantum spin-ice layer (FM layer)
120, 220 buffer layer
142, 144, 242, 244 pair of electrodes
150 voltage application means
152 variable voltage source
154A, 154B switch
160 detection circuit
162 capacitor
164 resistor
166 voltmeter
200A, 200B memory element
202A, 202B substrate
204, 206 surface
210 first ferromagnetic quantum spin-ice layer (first FM layer)
230 second ferromagnetic quantum spin-ice layer (second FM layer)
250 magnetic detector element
30 layer under test
32, 36 L and R ferromagnetic quantum spin-ice sections
34 gap section The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A monopole current generation device, comprising:
   a ferromagnetic quantum spin-ice layer;
   a buffer layer that is in contact with the ferromagnetic quantum spin-ice layer and is made of a material capable of exhibiting a quantum spin-liquid state; and
   a pair of electrodes, each of which being separated from each other in one of in-plane orientations of the buffer layer and disposed in contact with the buffer layer,
   wherein the buffer layer is different in material from the ferromagnetic quantum spin-ice layer.

2. The monopole current generation device of claim 1,
   wherein a material of the ferromagnetic quantum spin-ice layer is $Yb_2Ti_2O_7$, and
   wherein the material of the buffer layer is $Pr_2Zr_2O_7$, $Pr_2Sn_2O_7$, or $Pr_2Hf_2O_7$.

3. The monopole current generation device of claim 1,
   wherein the monopole current generation device is capable of generating a monopole current that has non-zero curl around the direction upon application of a voltage between the pair of electrodes, the monopole current flowing through the ferromagnetic quantum spin-ice layer and through another ferromagnetic quantum spin-ice layer that is in contact with the buffer layer on the other side of the ferromagnetic quantum spin-ice layer side.

4. A monopole current detection device, comprising:
   a ferromagnetic quantum spin-ice layer;
   a buffer layer that is in contact with the ferromagnetic quantum spin-ice layer and is made of a material capable of exhibiting a quantum spin-liquid state; and
   a pair of electrodes, each of which being separated from each other in one of in-plane orientations of the buffer layer and disposed in contact with the buffer layer.

5. The monopole current detection device of claim 4,
   wherein a material of the ferromagnetic quantum spin-ice layer is $Yb_2Ti_2O_7$, and
   wherein the material of the buffer layer is $Pr_2Zr_2O_7$, $Pr_2Sn_2O_7$, or $Pr_2Hf_2O_7$.

6. A memory element, comprising, in the following order:
   a first ferromagnetic quantum spin-ice layer;
   a buffer layer made of a material capable of exhibiting a quantum spin-liquid state; and
   a second ferromagnetic quantum spin-ice layer,
   wherein the memory element further comprising a pair of electrodes disposed in contact with the buffer layer, and
   wherein the buffer layer is different in material from the first ferromagnetic quantum spin-ice layer and from the second ferromagnetic quantum spin-ice layer.

7. The memory element of claim 6, wherein the memory element is configured to read at least one of either the direction or an intensity of magnetization in at least one of the first ferromagnetic quantum spin-ice layer and the second ferromagnetic quantum spin-ice layer.

8. The memory element of claim 6,
   wherein a material of at least one of the first ferromagnetic quantum spin-ice layer and the second ferromagnetic quantum spin-ice layer is $Yb_2Ti_2O_7$, and
   wherein the material of the buffer layer is $Pr_2Zr_2O_7$, $Pr_2Sn_2O_7$, or $Pr_2Hf_2O_7$.

9. The memory element according to claim 6, wherein the memory element holds at least temporarily at least one of direction and an intensity of magnetization in at least one of the first ferromagnetic quantum spin-ice layer and the second ferromagnetic quantum spin-ice layer.

10. The memory element of claim 9,
    wherein both of the magnetization in the first ferromagnetic quantum spin-ice layer and the magnetization in the second ferromagnetic quantum spin-ice layer are able to be flipped and these magnetizations are oriented antiparallel to each other, and
    wherein the pair of electrodes is configured to apply a voltage to the buffer layer, the voltage inducing an electric polarization in the buffer layer for reversing both of the magnetization in the first ferromagnetic quantum spin-ice layer and the magnetization in the second ferromagnetic quantum spin-ice layer.

* * * * *